United States Patent
Ishikawa et al.

(10) Patent No.: US 7,317,395 B2
(45) Date of Patent: Jan. 8, 2008

(54) RFID TAG AND METHOD OF MANUFACTURING THE SAME

(75) Inventors: Naoki Ishikawa, Kawasaki (JP); Shunji Baba, Kawasaki (JP); Hidehiko Kira, Kawasaki (JP); Hiroshi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 167 days.

(21) Appl. No.: 11/091,935

(22) Filed: Mar. 29, 2005

(65) Prior Publication Data
US 2006/0131427 A1    Jun. 22, 2006

(30) Foreign Application Priority Data
Dec. 2, 2004  (JP)  .............................. 2004-349237

(51) Int. Cl.
*G08B 13/14* (2006.01)
(52) U.S. Cl. ..................... 340/572.1; 235/492
(58) Field of Classification Search ............... 235/492; 343/718; 340/571.2
See application file for complete search history.

(56) References Cited

U.S. PATENT DOCUMENTS 5,804,882 A * 9/1998 Tsukagoshi et al. ........ 257/783

2002/0115278 A1  8/2002  Kawai .................. 438/612
2002/0124392 A1  9/2002  Chung .................. 29/739

FOREIGN PATENT DOCUMENTS

| CN | 1243294 A | 2/2000 |
|----|-----------|--------|
| EP | 0 977 145 A2 | 2/2000 |
| EP | 1 167 068 A1 | 1/2002 |
| EP | 1167068 A1 * | 1/2002 |
| JP | 2000-311226 | 11/2000 |

OTHER PUBLICATIONS

Patent Abstracts of Japan Publ. No. 2003163232, Jun. 6, 2003, Fujitsu Ltd.*

* cited by examiner

*Primary Examiner*—Jeffery Hofsass
*Assistant Examiner*—Shirley Lu
(74) *Attorney, Agent, or Firm*—Kratz, Quintos & Hanson, LLP

(57) ABSTRACT

The present invention provides a radio frequency identification (RFID) tag which exchanges information with an external device in a noncontact manner, in which a paste is used as a material for an antenna, and which is designed to avoid the problem due to swelling of the paste caused by a pressing force from bumps of an IC chip. A paste escape recess is provided in which part of the paste provided to form the antenna is caused to flow therein by the pressure received from the bumps when the IC chip with the bumps is connected to the antenna.

8 Claims, 11 Drawing Sheets

RFID TAG AND METHOD OF MANUFACTURING THE SAME

BACKGROUND OF THE INVENTION

1. Field of the Invention

The present invention relates to a radio frequency identification (RFID) tag which exchanges information with an external device in a noncontact manner and a method of manufacturing the same. In some cases, among those skilled in the technical field corresponding to the present invention, the "RFID tag" referred to in this specification is called "RFID tag inlay" as an internal constituent member (inlay) for an "RFID tag". In some other cases, this "RFID tag" is called "wireless IC tag". Also, this "RFID" tag comprises a noncontact-type ID card.

2. Description of the Related Art

In recent years, various types of RFID tags capable of noncontact information exchange by means of radio waves with external devices typified by reader/writers have been proposed. One of the various types of RFID tags proposed has an antenna pattern for radio wave communication and an IC chip mounted on a base sheet made of a plastic or paper. One of possible applications of such type of RFID tag is that the RFID tag is attached to an article and information about the article is exchanged with an external device for identification or the like of the article.

FIGS. 1 (A) and (B) are a front view and a sectional side view, respectively, of an example of an RFID tag.

The RFID tag 1 shown in FIG. 1 is constituted by an antenna 12 provided on a base 13 formed of a material in the form of a sheet such as a polyethylene telephthalate (PET) film, an IC chip 11 connected to the antenna 12 through bumps 16, and a cover sheet 14 bonded to the base 13 by an adhesive 15 so as to cover the antenna 12 and the IC chip 11.

The IC chip 11 constituting the RFID tag 1 is capable of exchanging information with an external device by performing wireless communication through the antenna 12.

Various applications including the above-mentioned one have been presented with respect to this type of RFID tag, which however has been hampered by high manufacturing cost. Therefore various attempts have been made to reduce the manufacturing cost of the RFID tag.

As one of the attempts to reduce the manufacturing cost, there has been pursued the idea of forming an antenna by using a paste material which is made conductive by blending a metallic filler (Ag in ordinary cases) with a resin material such as an epoxy resin (Japanese Patent Laid-Open No. 2000-311226 (paragraph [0066])). If such a paste material can be used to replace a thin sheet of a metallic material such as Cu, Al or Au, it can largely contribute to a reduction in the manufacturing cost of the RFID tag.

In manufacture of the RFID tag shown in FIG. 1, the IC chip 11 is connected to the antenna 12 formed on the surface of the base 13 formed of a PET member in the form of a sheet or the like, through the bumps (metal protrusions) 16 formed on electrodes of the IC chip 11. However, in a case where the antenna 12 is formed by printing a case material, a problem described below may arise with the connection between the IC chip 11 and the antenna 12.

FIG. 2 (A) shows a case where a metal is used as an antenna material and FIG. 2 (B) shows a case where a paste is used as an antenna material to be compared with each other.

An antenna 121 (in FIG. 2 (A)) formed of a thin sheet of a metal or an antenna 122 formed of a paste material (in FIG. 2 (B)) is formed on the base 13 formed of a PET member. The bumps 16 are formed on electrodes 111 on the IC chip 11 in each of the cases shown in FIGS. 2(A) and (B).

FIGS. 2 (A) and (B) show a state in which the IC chip 11 with bumps 16 is placed on the base 13 on which the antenna 121 or 122 is formed, the bumps 16 facing the base 13, and in which the IC chip 11 is connected to the antenna 121 or 122 through the bumps 16.

In FIG. 2, illustration of the adhesive 15 and the cover sheet 14 shown in FIG. 1 (B) is omitted. At the time of connection, the IC chip 11 is pressed from above as viewed in the figure with a jig (not shown). A pressing force is thereby applied from the bumps 16 to the antenna 121 or 122. In the case of the antenna 121 made of a metallic material as shown in FIG. 2(A), there is no problem with this pressing, since the hardness of the antenna 121 is high. In the case of the antenna 122 made of a paste material as shown in FIG. 2 (B), there is a problem described below. A swelling 122a of paste material forming the antenna 122 around the bump 16 is produced. In this case, the necessary insulation distance cannot be maintained between the IC chip 11 and the antenna 122. If this distance is changed, characteristics of the RFID tag including a wireless communication characteristic (hereinafter referred to as "tag characteristics") are changed. This causes variations in tag characteristics when the RFID tags are mass-manufactured.

The method of mounting various types of IC chips on a circuit board apart from the RFID tag is being widely practiced. In ordinary cases, a multiplicity of bumps are formed on an IC chip and the pressing force per bump is small even when a paste material is used as a wiring material on a circuit board and, therefore, there is no serious problem due to protrusion of the paste material.

In contrast, in the case of the RFID tag, the number of bumps provided in one IC chip for connection to the antenna is about two or four, the pressing force per bump is extremely large presenting the above-mentioned problem of a swelling in paste material. In order to reduce the pressing force, it is necessary to reduce the pressing force applied when the IC chip is placed, by an apparatus for placing the IC chip on the base, to an extremely small value in comparison with the case of placing an ordinary IC chip on which a multiplicity of bumps are formed. However, considering the presence of an adhesive between the base and the IC chip, it is extremely difficult to reduce the pressing force to an extremely small value while enabling a reliable connection to be made in a short time.

SUMMARY OF THE INVENTION

The present invention has been made in view of the above circumstances and provides an RFID tag using a paste as a material for an antenna and capable of avoiding the problem that the tag characteristics are changed by the above-mentioned rise of the paste, and a method of manufacturing the RFID tag.

According to a first aspect of the present invention, there is provided an RFID tag having a base, an antenna for communication provided on the base, a circuit chip connected to the antenna through bumps, the circuit chip performing wireless communication through the antenna, wherein the antenna is formed of a paste in which a metallic filler is blended with a resin material, and a paste escape portion, in which part of the paste provided to form the antenna is caused to flow therein by a pressure received from the bumps when the circuit chip with the bumps is connected to the antenna, is provided.

In the RFID tag in the first aspect of the present invention, the paste escape portion is provided to avoid the problem due to swelling of the paste described above with reference to FIG. 2 (B).

In the RFID tag in the first aspect of the present invention, the paste escape portion may be recesses provided at positions adjacent to portions of the base which receive the pressure from the bumps when the circuit chip with the bumps is connected to the antenna, or may be plural grooves between projections provided on portions of the antenna with which the bumps contact. Or it also may be plural grooves provided in the surface of each of the bumps which contacts with the antenna.

Further, in the RFID tag in the first aspect of the present invention, each of the bumps may have a projection formed at the central portion on its surface on the antenna side, and the paste escape portion may include gaps formed between the antenna surface and the bump along a portion of the bump encircling the projection.

According to a second aspect of the present invention, there is provided an RFID tag having a base, an antenna for communication provided on the base, a circuit chip connected to the antenna through bumps, the circuit chip performing wireless communication through the antenna, wherein the antenna is formed of a paste in which a metallic filler is blended with a resin material, and a coating film which is capable of suppressing swelling of the paste forming the antenna against a pressure received from the bumps when the circuit chip with the bumps is connected to the antenna, and through which the bumps are passed to be connected to the antenna, is provided on an upper surface of the antenna.

In the RFID tag in the second aspect of the present invention, the coating film is provided to avoid the problem due to swelling of the paste described above with reference to FIG. 2 (B), thus achieving the same effect as that of the RFID tag in the first aspect.

According to the first aspect of the present invention, there is provided a method of manufacturing an RFID tag, including the steps of printing an antenna for communication on a base by using a paste in which a metallic filler is blended with a resin material, mounting a circuit chip with bumps capable of performing wireless communication through the antenna, the circuit chip and the antenna being connected to each other through the bumps, and forming a paste escape portion in which part of the paste provided to form the antenna is caused to flow therein by a pressure received from the bumps when the circuit chip with the bumps is connected to the antenna.

According to the second aspect of the present invention, there is provided a method of manufacturing an RFID tag, including the steps of printing an antenna for communication on a base by using a paste in which a metallic filler is blended with a resin material, mounting a circuit chip with bumps capable of performing wireless communication through the antenna, the circuit chip and the antenna being connected to each other through the bumps, and forming on an upper surface of the antenna a coating film which is capable of suppressing swelling of the paste forming the antenna against a pressure received from the bumps when the circuit chip with the bumps is connected to the antenna, and through which the bumps are passed to be connected to the antenna.

According to the present invention, as described above, a paste is used as the material of an antenna thereby solving the problem related to the tag characteristic variation due to swelling of the paste material caused by the pressing force received from the bumps of the circuit chip.

DETAILED DESCRIPTION OF THE INVENTION

The present invention will be described below with respect to embodiments thereof.

Figure 3:
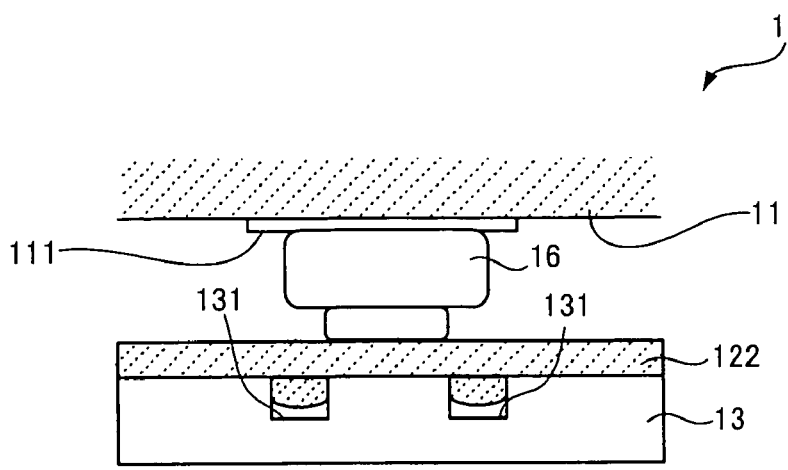
FIG. 3 is a sectional view of an RFID tag according to a first embodiment of the present invention.

FIG. 3 is a sectional view of an RFID tag according to the first embodiment of the present invention.

Figure 1A:
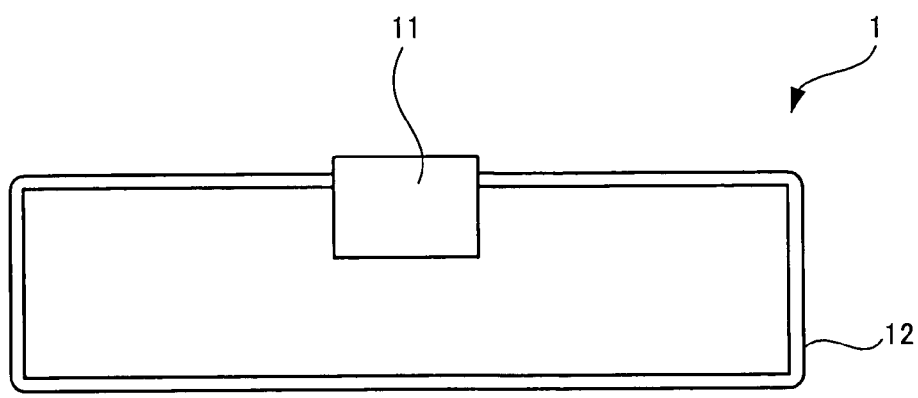
FIG. 1 (A) is a front view and FIG. 1 (B) is a sectional side view of an example of an RFID tag.
Figure 1B:
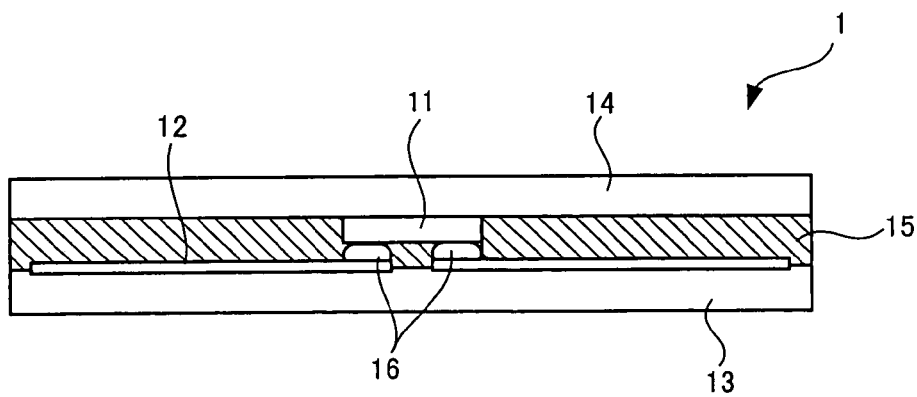
Figure 2A:
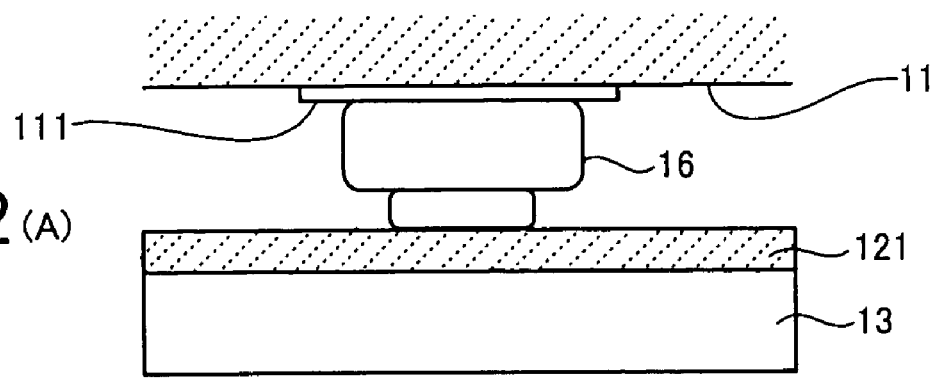
FIG. 2 (A) shows the case of using a metal as the material of an antenna and FIG. 2 (B) shows the case using a paste as the material of the antenna to be compared with FIG. 2 (A)
Figure 2B:
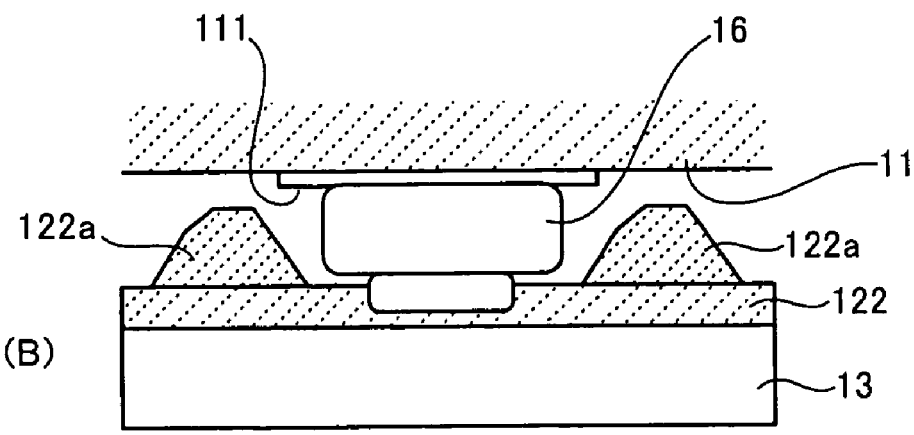

In FIG. 3 and other figures referred to below, constituents corresponding to those of the RFID tag described above with reference to FIG. 2 are indicated by the same reference numerals and the description for them will not be repeated. Description will be made only of points of difference from the described RFID tag. In FIG. 3 and the other figures referred to below, illustration of the adhesive 15 between the base 13 and the IC chip 11 and the cover sheet 14 (see FIG. 1 (B)) that covers upper portions of the RFID tag is omitted, as is that in FIG. 2. Also, in the embodiments described below, the base 13 is formed of a PET member and the antenna 122 is formed by using a paste prepared by blending an Ag filler with a resin material such as an epoxy resin unless otherwise specified.

In the RFID tag 1A shown in FIG. 3, paste escape recesses 131 are formed at positions adjacent to portions of the base 13 which receive a pressing force from bumps 16 of the IC chip 11 when the IC chip 11 with bumps 16 is connected to the antenna 122. Receiving the pressing force from the bumps 16, part of the paste is caused to flow into the paste escape recesses 131. The desired insulation distance between the IC chip 11 and the antenna 122 is thereby maintained in the RFID tag 1A. The RFID tag 1A is free from a change in tag characteristics due to insufficiency of insulation distance.

Figure 4:
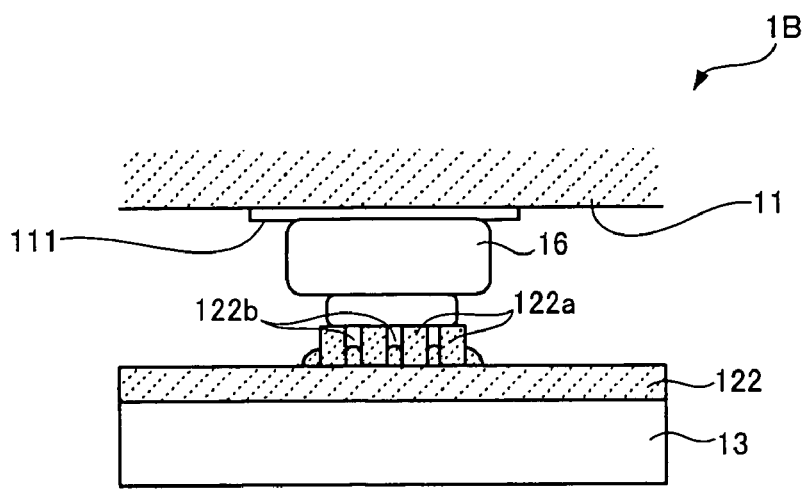
FIG. 4 is a sectional view of an RFID tag according to a second embodiment of the present invention.

FIG. 4 is a sectional view of an RFID tag in a second embodiment of the present invention.

In the RFID tag 1B shown in FIG. 4, a plurality of projections 122a are formed on portions of the antenna 122 which contact with bumps 16 of the IC chip 11. When the IC chip 11 with bumps 16 is connected to the antenna 122, part of the paste, which is caused to flow by receiving a pressing force from the bumps 16, flows into gaps 122b between the projections 122a. The desired insulation distance between the IC chip 11 and the antenna 122 is thereby maintained in the RFID tag 1B as well as in the RFID tag in the first embodiment shown in FIG. 3, thus stabilizing the tag characteristics.

Figure 5:
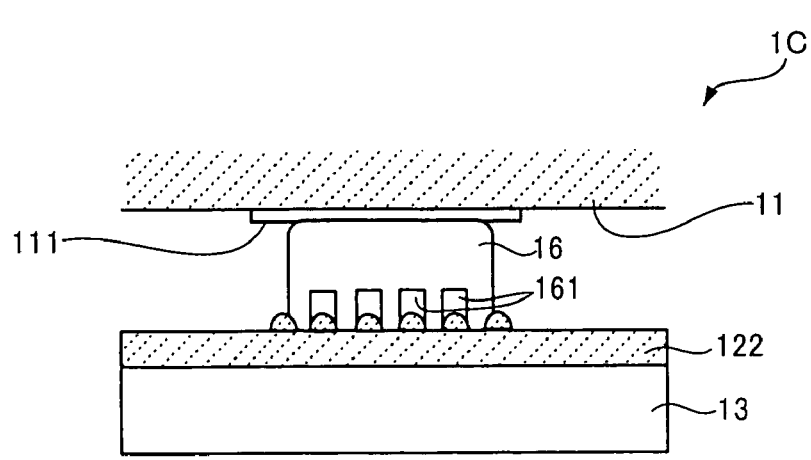
FIG. 5 is a sectional view of an RFID tag according to a third embodiment of the present invention.

FIG. 5 is a sectional view of an RFID tag in a third embodiment of the present invention.

In the RFID tag 1C shown in FIG. 5, a plurality of grooves 161 are provided in the surface of bumps 16 which contact with the antenna 122. When the IC chip 11 with bumps 16 is connected to the antenna 122, part of the paste, which is caused to flow by receiving the pressing force from the bumps 16, flows into the grooves 161 of the bumps 16. The desired insulation distance between the IC chip 11 and the antenna 122 is thereby maintained in the RFID tag 1C as well as in the RFID tags in the first and second embodiments shown in FIGS. 3 and 4, thus stabilizing the tag characteristics.

Figure 6:
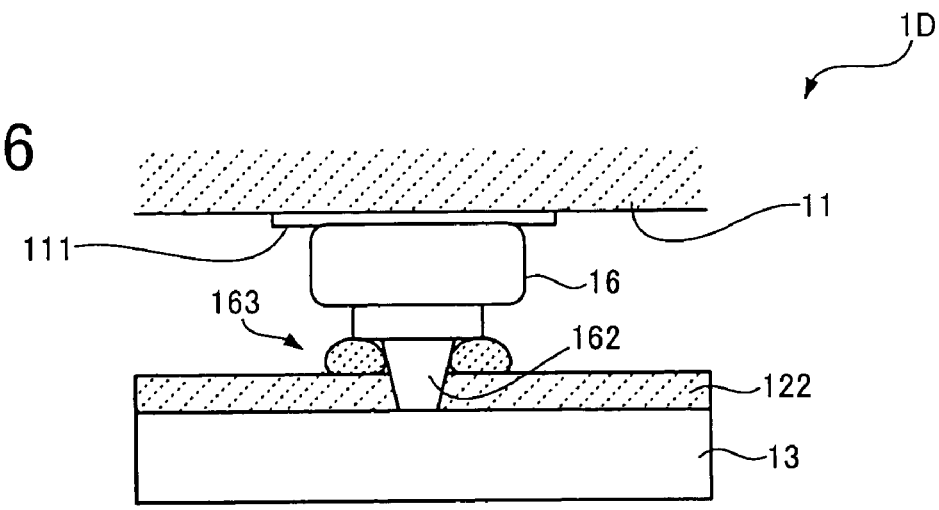
FIG. 6 is a sectional view of an RFID tag according to a fourth embodiment of the present invention.

FIG. 6 is a sectional view of an RFID tag in a fourth embodiment of the present invention.

In the RFID tag 1D shown in FIG. 6, a projection 162 is provided on a central portion of the surface of each bump 16 on the antenna 122 side. When the IC chip 11 with bumps 16 is connected to the antenna 122, part of the paste which is caused to flow by receiving the pressing force from the bumps 16 flows into a gap 163 formed along a portion of the bumps 16 encircling the central projection. The desired insulation distance between the IC chip 11 and the antenna 122 is thereby maintained in this RFID tag well as in the RFID tags in the above-described embodiments, thus obtaining stabilized tag characteristics.

Figure 7:
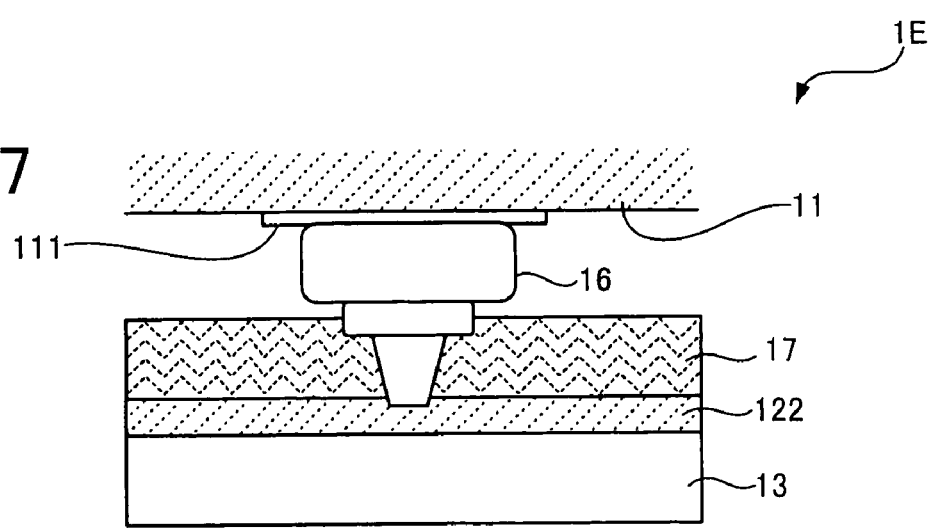
FIG. 7 is a sectional view of an RFID tag according to a fifth embodiment of the present invention.

FIG. 7 is a sectional view of an RFID tag in a fifth embodiment of the present invention.

In the RFID tag 1E shown in FIG. 7, a coating film 17 is formed on the upper surface of the antenna 122. The coating film 17 is formed of an insulating material such as polyethylene, epoxy, polyester or saponified ethylene vinyl acetate (EVA) and has such strength that when the IC chip 11 with bumps 16 is connected to the antenna 122, the tip of each bump 16 passes through the film to be connected to the antenna 122, and that the film suppresses swelling of the paste against the pressing force received from the bump 16 at the time of connection. The desired insulation distance between the IC chip 11 and the antenna 122 is maintained thanks to the existence of this coating film 17 in this RFID tag as well as in the RFID tags in the above-described embodiments, thus obtaining stabilized tag characteristics.

Methods of manufacturing the various RFID tags 1A to 1E described above will now be described.

FIG. 8 is a diagram showing a method of forming the bumps on the electrodes of the IC chip.

Figure 8A:
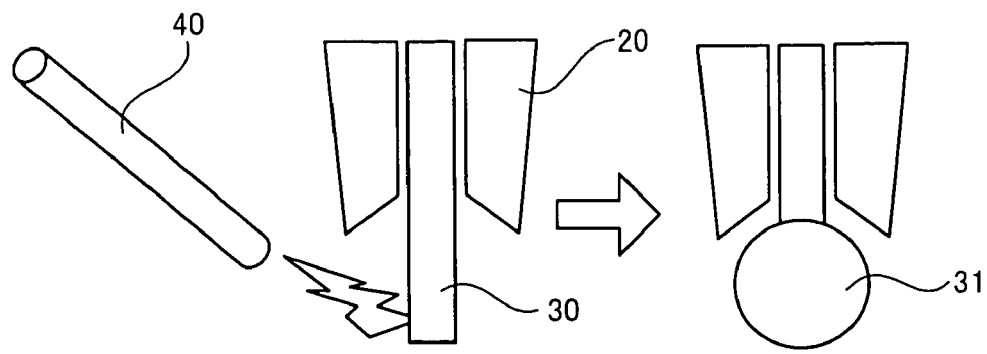
FIG. 8 is a diagram showing a method of forming bumps on electrodes of an IC chip.

First, a thin metal wire 30 to be formed as bumps is caused to project from the tip of a jig 20 with a hole, as shown in FIG. 8(A), thereby causing electric between the thin metal wire 30 and a discharge electrode 40. A portion of the thin metal wire 30 at the tip is molten by the discharge energy to form a metal ball 31.

Figure 8B:
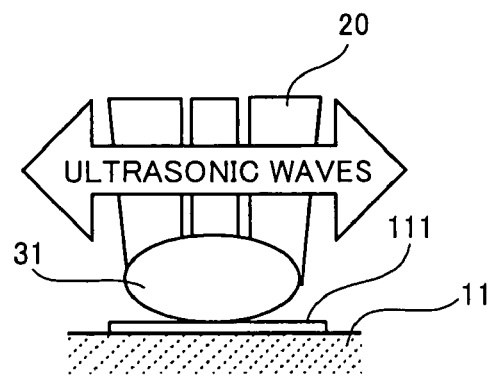
Figure 8C:
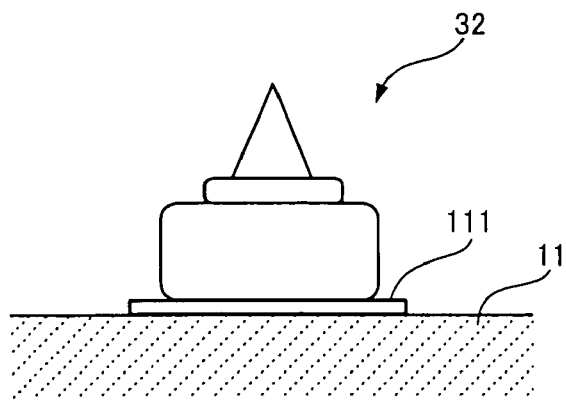

Subsequently, the metal ball 31 is pressed against the electrode 111 of the IC chip 11 and ultrasonic waves are applied to the metal ball 31 through the jig 20, as shown in FIG. 8(B). The metal ball 31 is joined to the electrode 111 of the IC chip 11 by the ultrasonic waves. When the jig 20 is removed, the metal ball 31 and the thin metal wire 30 at the foot are torn off to form the bump in original form 32 on the electrode 111 of the IC chip 11, as shown in FIG. 8(C).

Figure 9:
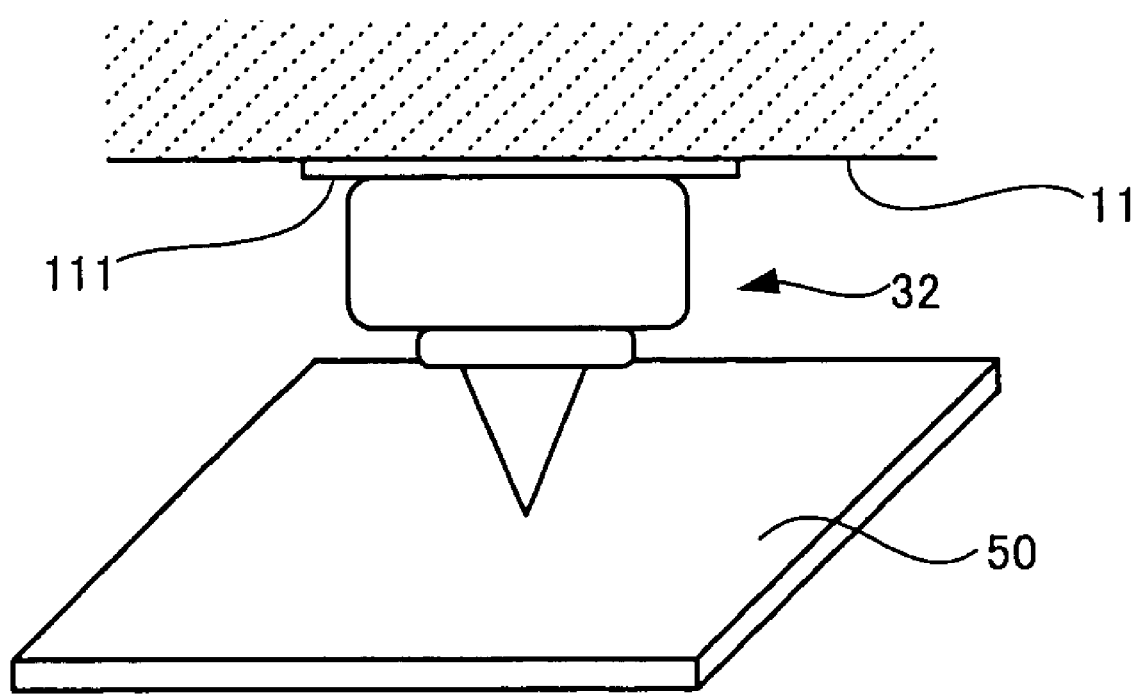
FIG. 9 is a diagram showing a method of leveling the bump.
Figure 10:
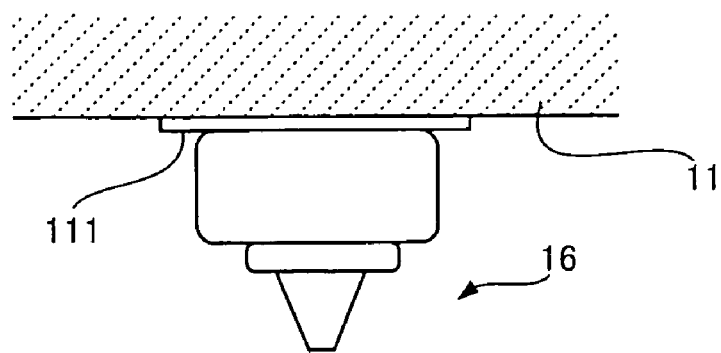
FIG. 10 is a diagram showing the bump after leveling.
Figure 10:
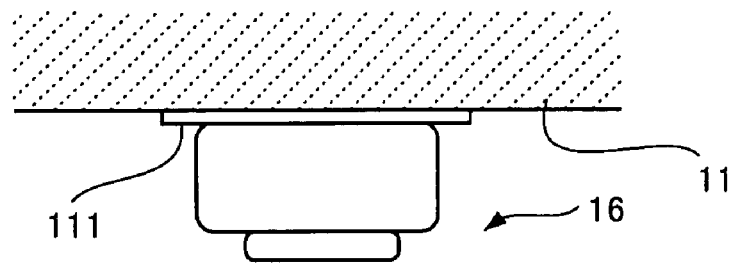
Figure 10:
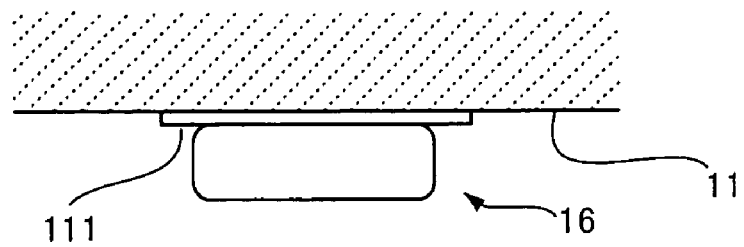

FIG. 9 is a diagram showing a method of leveling the bump, and FIG. 10 is a diagram showing the bump after leveling.

After being formed on the electrode 111 of the IC chip 11 as shown in FIG. 8, the bump in original form 32 is pressed on a flat surface of a glass plate 50, as shown in FIG. 9. The load for this pressing and the pressing height are selected to change the shape of the bump. That is, the bump 16 having the shape shown in FIG. 10 (A) is formed in the case of low-load high-position pressing; the bump 16 having the shape shown in FIG. 10 (B) is formed in the case of medium-load medium-position pressing; and the bump 16 having the shape shown in FIG. 10 is formed in the case of high-load low-position pressing.

Figure 11A:
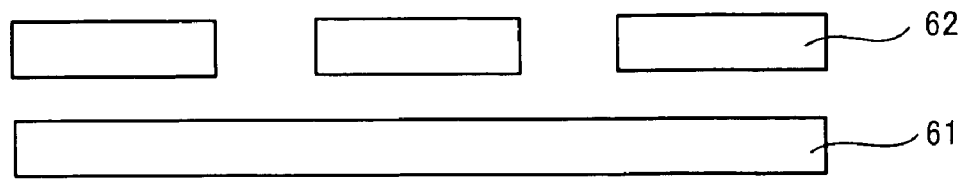
FIG. 11 is a diagram showing a method of forming paste escape recesses in the RFID tag shown in FIG. 3.
Figure 11B:
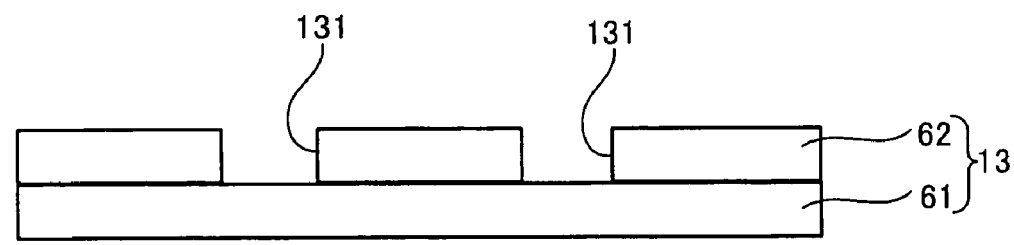
Figure 11C:
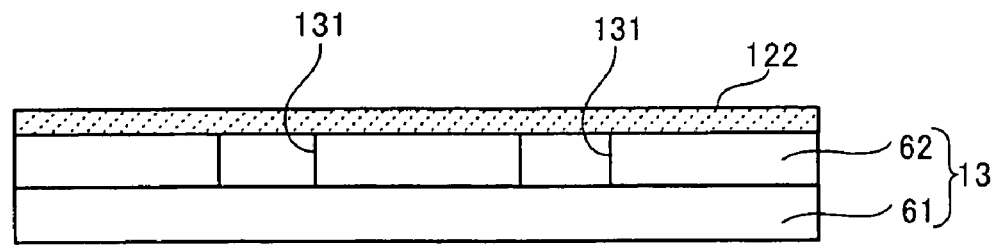

FIG. 11 is a diagram showing a method of forming paste escape recesses 131 of the RFID tag 1A shown in FIG. 3.

A PET film 61 for supporting and a PET film 62 having holes bored therein in correspondence with the paste escape recesses 131 shown in FIG. 3 are prepared (FIG. 11(A)). The two PET films 61 and 62 are stuck on each other to form the base 13 with paste escape recesses 131 in the RFID tag 1A shown in FIG. 3 (FIG. 11 (B)), and the antenna 122 is formed by printing a paste on the base 13. As the material of the antenna, a paste should have such a viscosity that the paste does not flow into the paste escape recesses 131 and does not fill the voids in the paste escape recesses 131 when no particular external force is applied.

When the IC chip with bumps is placed and pressed on the paste, the paste which receives the pressing force from the bumps 16 flows into the paste escape recesses 131, as shown in FIG. 3.

Figure 12A:
FIG. 12 is a diagram showing another example of a method of forming paste escape recesses in the RFID tag shown in FIG. 3.
Figure 12B:
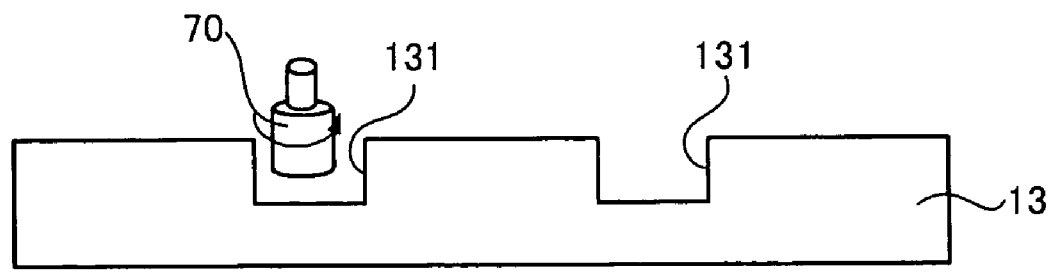
Figure 12C:
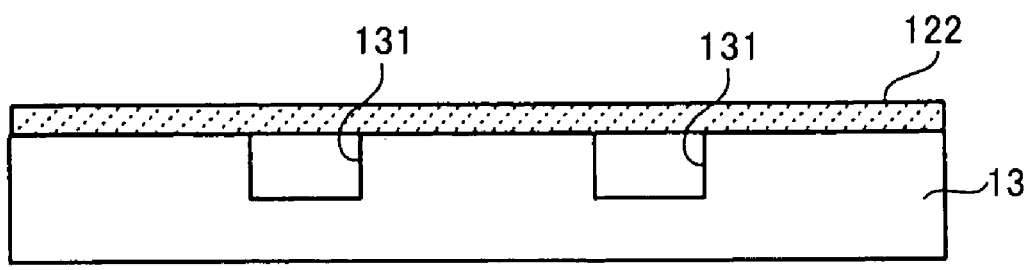

FIG. 12 is a diagram showing an example of another method of forming the paste escape recesses 131 in the RFID tag 1A shown in FIG. 3.

In the example shown in FIG. 11 two PET films 61 and 62 are prepared and stuck on each other. In FIG. 12 (A), a PET film 63 having a thickness corresponding to the thickness of the two PET films 61 and 62 after sticking is prepared and portions where paste escape recesses 131 are to be formed are bored with a boring tool 70 (FIG. 12 (B)), thereby forming the base 13 in which paste escape recesses 131 are formed. The same step as in FIG. 11 is performed to form the antenna 122 by printing the paste on the base 13.

While in FIG. 12 (B) the formation of paste escape recesses 131 by boring is described, chemical etching may be performed instead of boring to form paste escape recesses 131.

Figure 13:
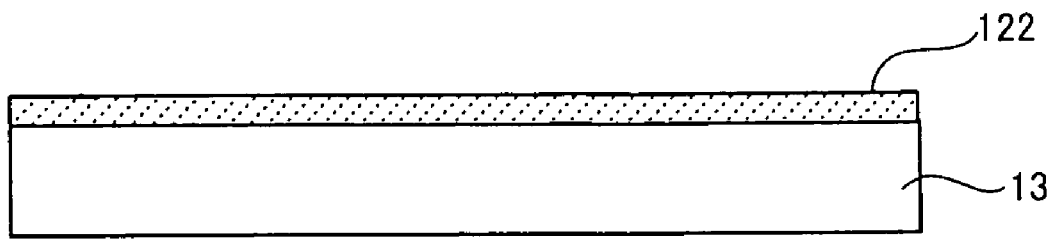
FIG. 13 is a diagram showing a method of forming projections in the RFID tag shown in FIG. 4.
Figure 13:
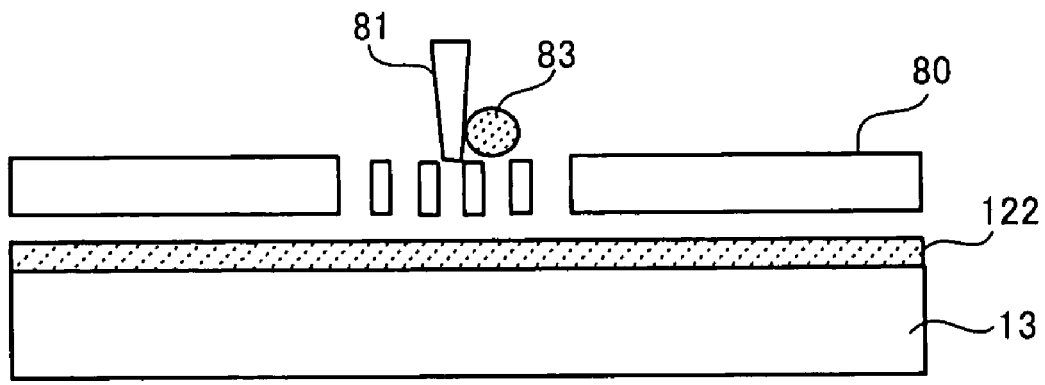
Figure 13:
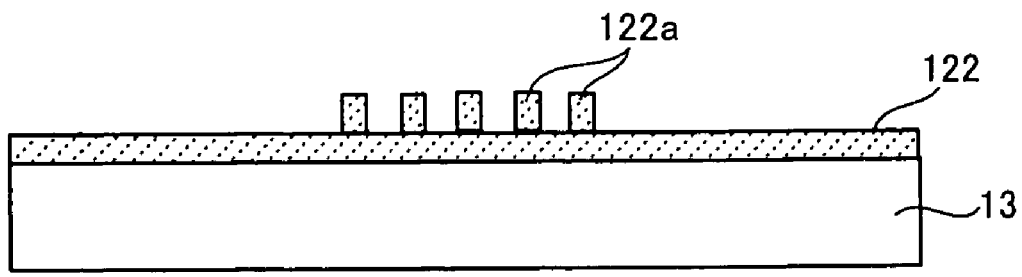

FIG. 13 is a diagram showing a method of forming projections 122a in the RFID tag 1B shown in FIG. 4.

The antenna 122 is formed on the base 13 by printing and dried to be hardened (FIG. 13(A)). A printing master 80 having holes formed in the portions which correspond to the projections shown in FIG. 4 is thereafter placed on the antenna and the paste 83 of the same material as that of the antenna 122 is printed by being forced into the holes of the printing master 80 with a squeegee 81 (FIG. 13(B)).

The printing master 80 for forming the projections is removed and the paste is dried to be hardened, thereby forming projections 122a on the antenna 122 (FIG. 13(C)).

As the printing master 80, a thin plate of Al, SUS or the like having holes formed at the desired positions by etching can be used. Although it is not shown in the drawings and not particularly described, a printing master is also used for printing an antenna and printing of the paste is performed by using a squeegee.

Figure 14:
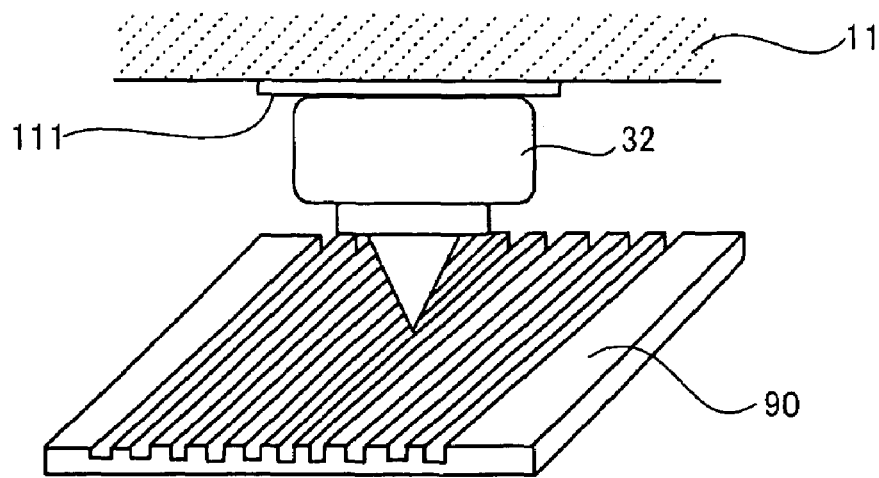
FIG. 14 is a diagram showing a method of forming grooves in the bumps 16 in the RFID tag shown in FIG. 5.
Figure 15:
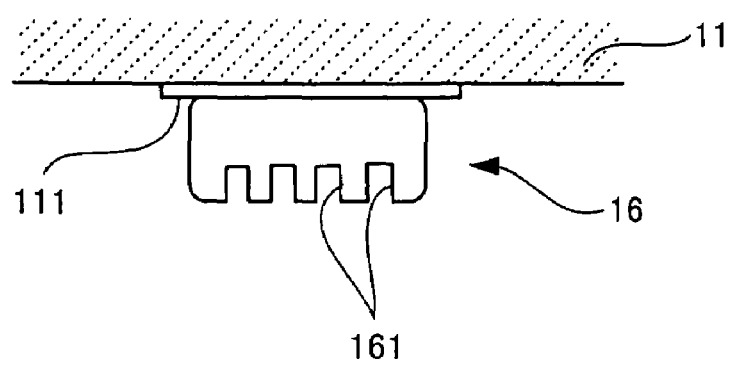
FIG. 15 is a diagram showing the bump in which grooves are formed by the method shown in FIG. 14.

FIG. 14 is a diagram showing a method of forming grooves 161 in the bumps 16 of the RFID tag 1C shown in FIG. 5, and FIG. 15 is a diagram showing the bumps in which the grooves are formed by the method.

After the bumps in original form 32 have been formed on the electrodes 111 of the IC chip 11 as described above with reference to FIG. 8, they are pressed against a glass plate 90 having grooves formed in its surface. Bumps 16 having grooves 161 formed therein are thereby formed, as shown in FIG. 15.

The grooves in the glass plate 90 can be formed, for example, by cutting the surface of the glass plate 90 with a diamond cutter such as one used for cutting a semiconductor ware. Etching may alternatively be performed on the surface of the glass plate 90 to form the grooves in the glass plate surface. The depth of the grooves 161 in the bumps 16 shown in FIG. 15 is adjusted by changing the depth of the grooves formed in the glass surface and the pressure at which the bumps in the original form is pressed against the glass surface in which the grooves are formed.

The RFID tag 1D shown in FIG. 6 is characterized in that each bump 16 has the projection 162 at a center of the surface on the antenna 122 side. This can be realized in such a manner that the bumps 16 shown in FIG. 10 (A) is formed by adjusting the load and height when the bump in original form 32 is pressed against the surface of the glass plate 50 in leveling described above with reference to FIG. 9.

The RFID tag 1E shown in FIG. 7 is realized in such a manner that after the antenna 122 has been formed by printing and drying of a paste, coating with the above-mentioned insulating material (for example, spraying of the material) is performed to form coating film 17. In this case, however, the bumps 16 are formed by the above-described leveling (see FIGS. 9 and 10) so as to have a projection capable of passing through the coating film.

What is claimed is:

1. An RFID tag comprising:
   a base;
   an antenna for communication provided on the base;
   a circuit chip connected to the antenna through bumps, the circuit chip performing wireless communication through the antenna,
   wherein the antenna is formed of a paste in which a metallic filler is blended with a resin material; and
   a paste escape portion, in which part of the paste provided to form the antenna is caused to flow therein by a pressure received from the bumps when the circuit chip with the bumps is connected to the antenna, is provided.

2. The RFID tag according to claim 1, wherein the paste escape portion comprises recesses provided at positions adjacent to portions of the base which receive the pressure from the bumps when the circuit chip with the bumps is connected to the antenna.

3. The RFID tag according to claim 1, wherein the paste escape portion comprises gaps between a plurality of projections provided on portions of the antenna with which the bumps contact.

4. The RFID tag according to claim 1, wherein the paste escape portion comprises a plurality of grooves provided in the surface of each of the bumps which contacts with the antenna.

5. The RFID tag according to claim 1, wherein each of the bumps has a projection formed on the central portion of its surface on the antenna side, and the paste escape portion comprises gaps formed between the antenna surface and the bump along a portion of the bump encircling the projection.

6. An RFID tag comprising:
   a base;
   an antenna for communication provided on the base;
   a circuit chip connected to the antenna through bumps, the circuit chip performing wireless communication through the antenna,
   wherein the antenna is formed of a paste in which a metallic filler is blended with a resin material; and
   a coating film which is capable of suppressing swelling of the paste forming the antenna against a pressure received from the bumps when the circuit chip with the bumps is connected to the antenna, and through which the bumps are passed to be connected to the antenna, is provided on an upper surface of the antenna.

7. A method of manufacturing an RFID tag, comprising the steps of:
   printing an antenna for communication on a base by using a paste in which a metallic filler is blended with a resin material;
   mounting a circuit chip with bumps capable of performing wireless communication through the antenna, the circuit chip and the antenna being connected to each other through the bumps; and
   forming a paste escape portion in which part of the paste provided to form the antenna is caused to flow therein by a pressure received from the bumps when the circuit chip with the bumps is connected to the antenna.

8. A method of manufacturing an RFID tag, comprising the steps of:
   printing an antenna for communication on a base by using a paste in which a metallic filler is blended with a resin material;
   mounting a circuit chip with bumps capable of performing wireless communication through the antenna, the circuit chip and the antenna being connected to each other through the bumps; and
   forming on an upper surface of the antenna a coating film which is capable of suppressing swelling of the paste forming the antenna against a pressure received from the bumps when the circuit chip with the bumps is connected to the antenna, and through which the bumps are passed to be connected to the antenna.

* * * * *